United States Patent
Taylor

(10) Patent No.: US 11,907,287 B2
(45) Date of Patent: *Feb. 20, 2024

(54) SOURCE CLASSIFICATION USING HDMI AUDIO METADATA

(71) Applicant: The Nielsen Company (US), LLC, New York, NY (US)

(72) Inventor: Robert E. Taylor, Newbury, VT (US)

(73) Assignee: The Nielsen Company (US), LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/883,394

(22) Filed: Aug. 8, 2022

(65) Prior Publication Data

US 2023/0065182 A1 Mar. 2, 2023

Related U.S. Application Data

(63) Continuation of application No. 16/863,639, filed on Apr. 30, 2020, now Pat. No. 11,410,680.

(Continued)

(51) Int. Cl.
 *G06F 16/683* (2019.01)
 *G10L 25/57* (2013.01)
 (Continued)

(52) U.S. Cl.
 CPC ............ *G06F 16/683* (2019.01); *G06F 3/165* (2013.01); *G06F 18/24* (2023.01); *G10L 19/167* (2013.01);
 (Continued)

(58) Field of Classification Search
 CPC ........ G06F 16/683; G06F 3/165; G06F 18/24; G10L 19/167; G10L 25/30; G10L 25/57;
 (Continued)

(56) References Cited

U.S. PATENT DOCUMENTS 9,805,725 B2 10/2017 Crockett et al.
10,546,610 B2 1/2020 Leonard
(Continued)

FOREIGN PATENT DOCUMENTS

CN 114207606 A 3/2022
KR 101411107 6/2014
(Continued)

OTHER PUBLICATIONS

International Searching Authority, "International Search Report," issued in connection with PCT application No. PCT/US2020/037536, dated Sep. 25, 2020, 3 pages.

(Continued)

*Primary Examiner* — Linda Wong

(57) ABSTRACT

Methods, apparatus, systems and articles of manufacture are disclosed for source classification using HDMI audio metadata. An example apparatus includes a metadata extractor to extract values of audio encoding parameters from HDMI metadata obtained from a monitored HDMI port of a media device, the HDMI metadata corresponding to media being output from the monitored HDMI port; map the extracted values of the audio encoding parameters to a first unique encoding class (UEC) in a set of defined UECs, different ones of the set of defined UECs corresponding to different combinations of possible values of the audio encoding parameters capable of being included in the HDMI metadata; and identify a media source corresponding to the media output from the HDMI port based on one or more possible media sources mapped to the first UEC.

20 Claims, 5 Drawing Sheets

Related U.S. Application Data

(60) Provisional application No. 62/861,194, filed on Jun. 13, 2019.

(51) Int. Cl.
| | |
|---|---|
| *G06F 3/16* | (2006.01) |
| *G10L 19/16* | (2013.01) |
| *H03M 7/42* | (2006.01) |
| *H03M 7/30* | (2006.01) |
| *G11B 20/00* | (2006.01) |
| *G06F 18/24* | (2023.01) |
| *G10L 25/30* | (2013.01) |

(52) U.S. Cl.
CPC ............ *G10L 25/30* (2013.01); *G10L 25/57* (2013.01); *G11B 20/00* (2013.01); *H03M 7/30* (2013.01); *H03M 7/42* (2013.01); *G11B 2020/00014* (2013.01); *G11B 2020/00028* (2013.01)

(58) Field of Classification Search
CPC .......... G11B 20/00; G11B 2020/00014; G11B 2020/00028; H03M 7/30; H03M 7/42; H04H 60/58; H04H 60/31; H04N 21/25891; H04N 21/43635; H04N 21/44204; H04N 21/6582; H04N 21/8405
See application file for complete search history.

(56) References Cited

U.S. PATENT DOCUMENTS

| | | | |
|---|---|---|---|
| 10,579,372 | B1 | 3/2020 | Bahrami et al. |
| 10,687,122 | B2 | 6/2020 | Schmidmer et al. |
| 11,410,680 | B2 | 8/2022 | Taylor |
| 2007/0192782 | A1 | 8/2007 | Ramaswamy |
| 2011/0274156 | A1 | 11/2011 | Mighani et al. |
| 2014/0229970 | A1 | 8/2014 | Besehanic |
| 2016/0094873 | A1 | 3/2016 | Zou |
| 2016/0162255 | A1 | 6/2016 | Nishimura |
| 2018/0098122 | A1 | 4/2018 | Cho et al. |
| 2018/0255350 | A1* | 9/2018 | Rumreich .......... H04N 21/8456 |
| 2019/0122673 | A1 | 4/2019 | Rafii |
| 2019/0132652 | A1 | 5/2019 | Zhao et al. |
| 2020/0204875 | A1 | 6/2020 | Nielsen et al. |
| 2020/0395039 | A1 | 12/2020 | Taylor |

FOREIGN PATENT DOCUMENTS

| | | |
|---|---|---|
| KR | 20170067517 | 6/2017 |
| WO | 2006020560 A2 | 2/2006 |
| WO | 2017184648 A1 | 10/2017 |
| WO | 2020252341 A1 | 12/2020 |

OTHER PUBLICATIONS

International Searching Authority, "Written Opinion," issued in connection with PCT application No. PCT/US2020/037536, dated Sep. 25, 2020, 3 pages.

United States Patent and Trademark Office, "Notice of Allowance and Fee(s) Due", mailed in connection with U.S. Appl. No. 16/863,639 dated Apr. 5, 2022, 9 pages.

HDMI: "High-Definition Multimedia Interface Specification Version 1.4", Mar. 23, 2010 (Mar. 23, 2010), XP009133650, retrieved from the Internet: URL:http://wenku.baidu.com/view/e7db77d184254b35eefd34d0.html [retrieved on Jun. 16, 2010].

HDMI: "High-Definition Multimedia Interface Specification Version 2.0", Sep. 4, 2013 (Sep. 4, 2013), KP055388172, retrieved from the Internet: URL:hdmiforum.org [retrieved on Jul. 5, 2017].

International Searching Authority, "International Preliminary Report on Patentability," issued in connection with International Patent Application No. PCT/US2020/037536, dated Dec. 23, 2021, 7 pages.

European Patent Office, "Extended European Search Report," issued in connection with European Patent Application No. 20823564.8, dated Apr. 21, 2023, 9 pages.

\* cited by examiner

FIG. 3

| HDMI Source | Programming Source | Network or Movie | Network # or Streaming Client | IEC61937 Data Type | Audio Bit Rate | dialnorm | BSID | CMixLev | LFEon | acmod/AMODE | BEC | General Source Disambiguation Confidence |
|---|---|---|---|---|---|---|---|---|---|---|---|---|
| Stm HW 1 | Stm Src 1 | Movie 1 | Stm Client 1 | E-AC-3 | 640 | -31 | 4 | -3 | ON | 3/2.1 (5.1) | 10 | 33% |
| Stm HW 1 | Stm Src 2 | Movie 2 | Stm Client 2 | E-AC-3 | 640 | -31 | 4 | -3 | ON | 3/2.1 (5.1) | 10 | 33% |
| Stm HW 1 | Stm Src 2 | Movie 3 | Stm Client 2 | E-AC-3 | 640 | -31 | 4 | -3 | ON | 3/2.1 (5.1) | 10 | 33% |
| Stm HW 1 | Stm Src 2 | Movie 4 | Stm Client 2 | E-AC-3 | 640 | -31 | 4 | -3 | ON | 3/2.1 (5.1) | 10 | 33% |
| Stm HW 1 | Stm Src 3 | Movie 5 | Stm Client 3 | E-AC-3 | 640 | -31 | 4 | -3 | ON | 3/2.1 (5.1) | 10 | 33% |
| Stm HW 1 | Stm Src 4 | Movie 6 | Stm Client 3 | E-AC-3 | 640 | -31 | 4 | -3 | ON | 3/2.1 (5.1) | 10 | 33% |
| Stm HW 1 | Stm Src 1 | Movie 7 | Stm Client 1 | AC-3 | 640 | -31 | 4 | -3 | ON | 3/2.1 (5.1) | 10 | 33% |
| Stm HW 1 | Stm Src 1 | Movie 8 | Stm Client 1 | PCM | No data | No data | No data | No data | No data | No data | 10 | 50% |
| Stm HW 1 | Stm Src 1 | Movie 9 | Stm Client 1 | PCM | No data | No data | No data | No data | No data | No data | 10 | 50% |
| Stm HW 2 | Stm Src 3 PAU | Movie 10 PAU | 999 | AC-3 | 32 | -31 | 6 | No data | OFF | 1+1 | 3 | 100% |
| Stm HW 2 | Stm Src 3 PAU | Movie 11 PAU | 999 | AC-3 | 32 | -31 | 6 | No data | OFF | 1+1 | 3 | 100% |
| Stm HW 2 | Stm Src 3 PAU | Movie 12 PAU | 999 | AC-3 | 192 | -31 | 6 | No data | OFF | 2/0 | 1 | 100% |
| Stm HW 2 | General Cable Chnl | Network 1 | 711 | AC-3 | 192 | -24 | 6 | No data | OFF | 2/0 | 2 | 100% |
| Stm HW 2 | Stm Src 3 | Movie 10 | 999 | AC-3 | 384 | -31 | 6 | -3 | ON | 3/2.1 (5.1) | 3 | 100% |
| Stm HW 2 | Stm Src 3 | Movie 11 | 999 | AC-3 | 384 | -30 | 6 | -3 | ON | 3/2.1 (5.1) | 4 | 100% |
| Stm HW 2 | General Cable Chnl | Network 2 | 748 | AC-3 | 384 | -27 | 6 | -3 | ON | 3/2.1 (5.1) | 10 | 100% |
| Stm HW 2 | General Cable Chnl | Network 3 | 703 | AC-3 | 384 | -27 | 6 | No data | OFF | 2/0 | 5 | 100% |
| Stm HW 2 | General Cable Chnl | Network 4 | 734 | AC-3 | 384 | -24 | 6 | -3 | ON | 3/2.1 (5.1) | 6 | 100% |
| Stm HW 2 | General Cable Chnl | Network 5 | 775 | AC-3 | 384 | -24 | 6 | -3 | ON | 3/2.1 (5.1) | 6 | 100% |
| Stm HW 2 | General Cable Chnl | Network 6 | 728 | AC-3 | 384 | -24 | 6 | -3 | ON | 3/2.1 (5.1) | 6 | 100% |
| Stm HW 2 | General Cable Chnl | Network 7 | 818 | AC-3 | 384 | -24 | 6 | -3 | ON | 3/2.1 (5.1) | 6 | 100% |
| Stm HW 2 | General Cable Chnl | Network 8 | 736 | AC-3 | 384 | -24 | 6 | -3 | ON | 3/2.1 (5.1) | 6 | 100% |
| Stm HW 2 | General Cable Chnl | Network 9 | 764 | AC-3 | 384 | -24 | 6 | -3 | ON | 3/2.1 (5.1) | 6 | 100% |
| Stm HW 2 | General Cable Chnl | Network 10 | 717 | AC-3 | 384 | -24 | 6 | -3 | ON | 3/2.1 (5.1) | 6 | 100% |
| Stm HW 2 | General Cable Chnl | Network 11 | 701 | AC-3 | 384 | -24 | 6 | -3 | ON | 3/2.1 (5.1) | 6 | 100% |
| Stm HW 2 | General Cable Chnl | Network 12 | 722 | AC-3 | 384 | -24 | 6 | -3 | ON | 3/2.1 (5.1) | 6 | 100% |
| Stm HW 2 | General Cable Chnl | Network 13 | 34 | AC-3 | 384 | -24 | 6 | -3 | ON | 3/2.1 (5.1) | 6 | 100% |
| Stm HW 2 | General Cable Chnl | Network 14 | 727 | AC-3 | 384 | -24 | 6 | -3 | ON | 3/2.1 (5.1) | 6 | 100% |
| Stm HW 2 | General Cable Chnl | Network 15 | 735 | AC-3 | 384 | -24 | 6 | -3 | ON | 3/2.1 (5.1) | 6 | 100% |
| Stm HW 2 | General Cable Chnl | Network 16 | 795 | AC-3 | 384 | -24 | 6 | -3 | ON | 3/2.1 (5.1) | 6 | 100% |
| Stm HW 2 | General Cable Chnl | Network 17 | 716 | AC-3 | 384 | -24 | 6 | -3 | ON | 3/2.1 (5.1) | 6 | 100% |
| Stm HW 2 | General Cable Chnl | Network 18 | 702 | AC-3 | 384 | -24 | 6 | -3 | ON | 3/2.1 (5.1) | 6 | 100% |

SOURCE CLASSIFICATION USING HDMI AUDIO METADATA

RELATED APPLICATION

This patent arises from a continuation of U.S. patent application Ser. No. 16/863,639, which was filed on Apr. 30, 2020, which claims the benefit of U.S. Provisional Patent Application Ser. No. 62/861,194, which was filed on Jun. 13, 2019. U.S. patent application Ser. No. 16/863,639 and U.S. Provisional Patent Application Ser. No. 62/861,194 are hereby incorporated herein by reference in their entireties. Priority to U.S. patent application Ser. No. 16/863,639 and Provisional Patent Application Ser. No. 62/861,194 is hereby claimed.

FIELD OF THE DISCLOSURE

This disclosure relates generally to media source classification, and, more particularly, to source classification using high definition multimedia interface (HDMI) audio metadata.

BACKGROUND

HDMI is a transmission interface that is a common audiovisual standard for the transmission of high definition video, audio, and related media signals. In some examples, HDMI defines an interface for transferring compressed or uncompressed video and audio data between a digital audio/visual (A/V) source, such as a set-top box, a digital versatile disk (DVD) player, a satellite receiver, etc., and an A/V receiver/controller or display device, such as a television, a projector, etc.

BRIEF DESCRIPTION OF THE DRAWINGS

FIG. 3 is a table including parameters of HDMI audio metadata that may be used to perform source classification in accordance with teachings of this disclosure.

The figures are not to scale. In general, the same reference numbers will be used throughout the drawing(s) and accompanying written description to refer to the same or like parts.

Figure 1:
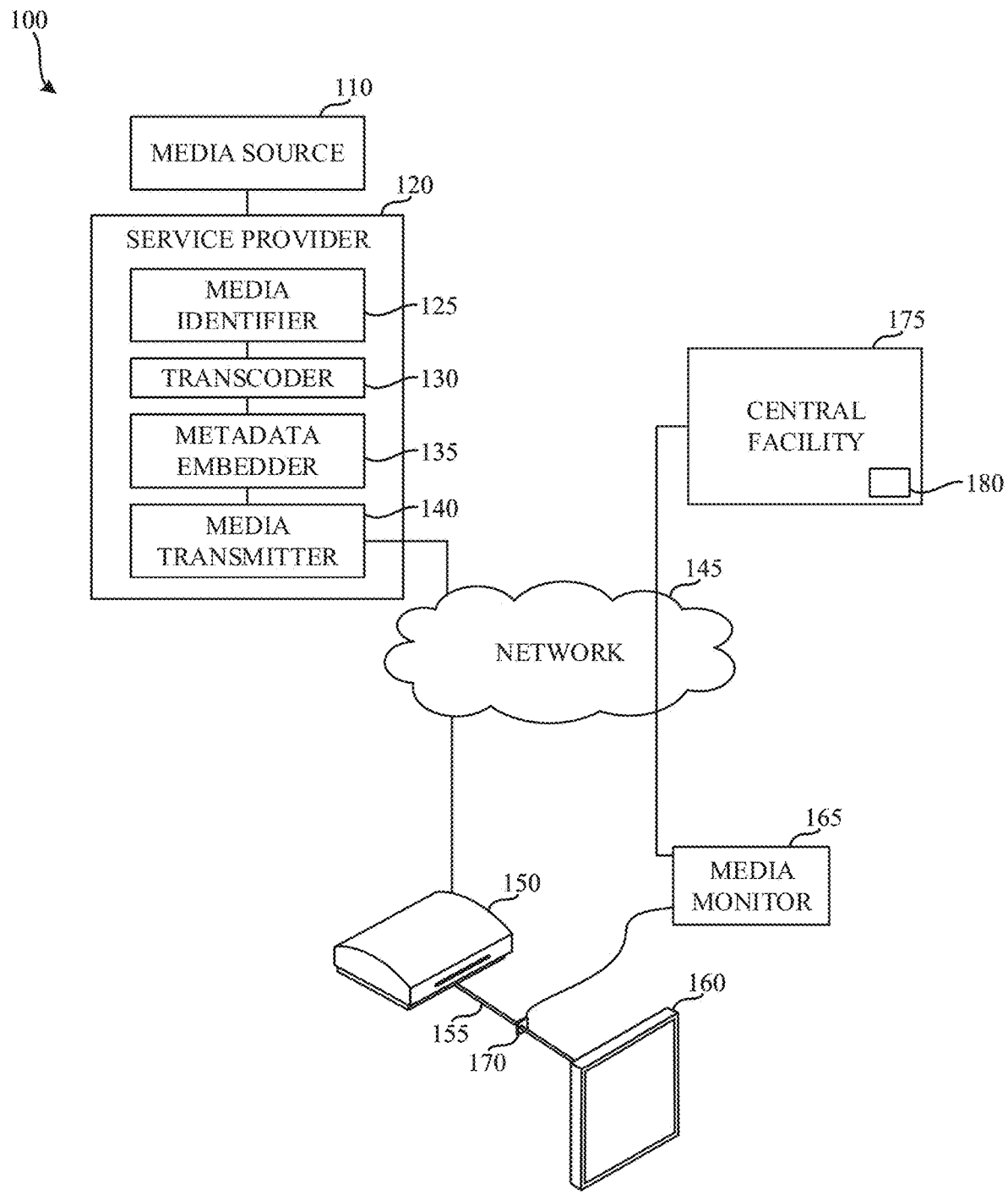
FIG. 1 is a block diagram of an example system including an example media monitor constructed in accordance with the teachings of this disclosure to perform source classification using HDMI audio data.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

Example technical solutions to perform source classification using HDMI audio metadata are disclosed. Such example technical solution may include one or more of methods, apparatus, systems, articles of manufacture (e.g., physical storage media), etc., to perform source classification using HDMI audio metadata in accordance with teachings of this disclosure.

IP/QAM hybrid set top boxes decode content from both general QAM-encoded cable channels and embedded Internet-connected DOCSIS/MoCA streaming clients. (As used herein, IP refers to Internet Protocol, QAM refers to Quadrature Amplitude Modulation, DOCSIS refers to Data Over Cable Service Interface Specification, and MoCA refers to Multimedia over Coax Alliance.) Unlike monitoring network traffic of devices with wireless local area network (LAN) connections (e.g., WiFi) or Ethernet connections to the Internet, monitoring network traffic of IP/QAM hybrid set top boxes to identify a content source is inherently difficult due to the complexity of the DOCSIS/MoCA specification and the lack of inexpensive commercial off-the-shelf (COTS) equipment to perform such monitoring. Therefore, techniques other than network traffic monitoring are needed to identify the currently tuned or streaming content source associated with a media presentation by an IP/QAM hybrid set top box or other such consumer premises equipment. Also, such techniques may be constrained to the available outputs on the consumer premises equipment. Furthermore, the analog audio path of such equipment may be subject to significant variability and/or degradation which adversely affects any attempt to analyze analog audio to identify source.

Example technical solutions disclosed herein identify media sources providing media to consumer electronic devices from HDMI audio encoding metadata. The audio of typical cable channels and streaming media assets (e.g., videos, programs, episodes, movies, etc.) are encoded in manners that, in some cases, use parameters that are unique to a specific source (e.g., cable channel, streaming service, etc.). When these parameters are unique, they can be used to specify unique encoding classes (UECs) capable of identifying the source of the media asset (e.g., videos, programs, episodes, movies, etc.). HDMI metadata contains digital copies of audio encoding parameters as they were encoded on the source. This metadata can be extracted directly from the HDMI bus without degradation and mapped to a source. HDMI also is typically an output, and sometimes the only output, available on IP/QAM hybrid set top boxes and is not subject to the variability and degradation inherent in other types of analog audio analysis (e.g., based on microphone pickup and/or analog line connections).

Example technical solutions disclosed herein can be implemented on professional-grade HDMI analysis hardware and/or on consumer-grade hardware. For example, technical solutions disclosed herein can be implemented by adapting HDMI audio extraction devices used by audience measurement systems, such as systems employed by The Nielsen Company (US), LLC. For example, the software executing on such a device can be modified to provide the metadata employed by disclosed example solutions to assign audio to a UEC and, thereby, identify the source of the audio based on the source(s) mapped to the UEC.

Further implementation details for disclosed example solutions to perform source classification using HDMI audio metadata are as follows. Digital audio encoding embeds a rich set of metadata in the audio stream, including parameters such as bit rate, dialog volume shift, center channel mix, bit stream identifier, etc. These parameters are used by decoders in consumer electronic equipment (e.g., televisions) to reproduce audio. Disclosed example technical solutions utilize combinations of these embedded parameters to create many (e.g., dozens or some other number) of unique encoding classes (UECs) that can be used to identify categories of both digital streaming assets and general cable channels (e.g., sources). Some UECs are shared by many sources so are not useful to disambiguate one from another. However, other UECs provide commercially valuable differentiation between sources. The parameters that make up a UEC are found in the publicly accessible portion of the HDMI audio stream. The hardware found in a commercially available, off-the-shelf, audio extractor can be used to access these parameters. The universal availability of HDMI for digital media transport makes it a particularly useful conduit from which to access these parameters.

FIG. 1 is a block diagram of an example system 100 constructed in accordance with the teachings of this disclosure to perform source classification using HDMI audio data. The example system 100 of FIG. 1 monitors media provided by an example media source 110 for presentation on an example media device 150 via an example network 145. The example of FIG. 1 includes an example service provider 120, an example media monitor 165, and an example central facility 175 of an audience measurement entity. While the illustrated example of FIG. 1 discloses an example implementation of the service provider 120 as an Internet service provider, other example implementations of the service provider 120 may additionally or alternatively be used. For example, the service provider 120 may be a cable service provider.

The media source 110 of the illustrated example of FIG. 1 corresponds to any one or more media source(s) capable of providing media for presentation via the media device 150. The media provided by the media source(s) 110 can provide any type of media, such as audio, video, multimedia, etc. Additionally, the media can correspond to live media, streaming media, broadcast media, stored media, on-demand content, etc. In some examples, the media source 110 may be a local source (e.g., DVD player, game console, etc.) that does not require receiving media from, but plays it locally.

The service provider 120 of the illustrated example of FIG. 1 provides media services to the media device 150 via, for example, IP/QAM hybrid set top box(es) provided by the media source 110. In the illustrated example, the service provider 120 modifies the media provided by the media source 110 prior to transmitting the media to the media device 150. In the illustrated example, the service provider 120 includes an example media identifier 125, an example transcoder 130, an example metadata embedder 135, and an example media transmitter 140.

The media identifier 125 of the illustrated example of FIG. 1 is implemented by a logic circuit such as a processor executing instructions, but it could additionally or alternatively be implemented by an application specific integrated circuit(s) (ASIC(s)), programmable logic device(s) (PLD(s)) and/or field programmable logic device(s) (FPLD(s)), an analog circuit, and/or other circuitry. The media identifier 125 of FIG. 1 extracts metering data (e.g., signatures, watermarks, etc.) from the media obtained from the media source 110. For example, the media identifier 125 can implement functionality provided by a software development kit (SDK) to extract one or more audio watermarks, one or more video (e.g., image) watermarks, etc., embedded in the audio and/or video of the media obtained from the media source 110. (For example, the media may include pulse code modulation (PCM) audio data or other types of audio data, uncompressed video/image data, etc.).

The example media identifier 125 of FIG. 1 determines (e.g., derives, decodes, converts, etc.) the metering data (e.g., such as media identifying information, source identifying information, etc.) included in or identified by a watermark embedded in, associated with, and/or transmitted with the media, and converts this metering data and/or the watermark itself into a text and/or binary format and/or other data type (e.g., text, binary, etc.) for insertion as metadata in streaming media. For example, the code/watermark itself may be extracted and inserted as metadata in, for example, a text or binary format in an ID3 tag. Thus, the metadata and/or media-identifying metadata included in the ID3 tag may be a text or binary representation of a code, a watermark, and/or metadata or data identified by a code and/or watermark, etc.

The example transcoder 130 of the illustrated example of FIG. 1 is implemented by a logic circuit such as a processor executing instructions, but could additionally or alternatively be implemented by any other logic circuit, ASIC, DSP, FPGA, and/or other analog and/or digital circuitry. In some examples, the transcoder 130 and the media identifier 125 are implemented by the same physical processor. In the illustrated example, the transcoder 130 employs any appropriate technique(s) to transcode and/or otherwise process the received media into a form suitable for viewing (e.g., a streaming format, a set-top-box format). For example, the transcoder 130 of the illustrated example transcodes the media in accordance with MPEG 2 audio/video compression for use via the HLS protocol. In some examples, the transcoder 130 transcodes media associated with a general cable channel to conform with AC-3 audio encoding.

The metadata embedder 135 of the illustrated example of FIG. 1 is implemented by a logic circuit such as a processor executing instructions, but could additionally and/or alternatively be implemented by any other logic circuit, ASIC, DSP, FPGA, and/or other analog and/or digital circuitry. In some examples, some or all of the transcoder 130, the media identifier 125, and the metadata embedder 135 are implemented by the same physical processor.

In the illustrated example, the metadata embedder 135 embeds the metadata determined by the media identifier 125 into a particular format to be included in or otherwise associated with the media. In some examples the metadata is embedded into a closed captioning transport stream of the media. In some examples, the metadata embedder 135 embeds metadata as one or more data fields of the streaming media based on a particular encoding format (e.g., AC-3).

In the illustrated example, the metadata embedder 135 embeds the metadata to define UECs that contain differentiating values for use in UEC source classification as disclosed herein. For example, the metadata embedder 135 embeds one or more of the following parameters, in combination, to define different UECs into which sources can be classified: IEC61937 data type, bit rate, dialog normalization average level, bitstream identifier, and center mix level. While the preceding parameters are AC-3 parameters in this example, the metadata embedder 135 may embed metadata parameters for other types of encoding in other examples. In the illustrated example, the metadata embedder 135 embeds metadata such that each source belongs to one UEC. For example, a general cable channel might have a UEC including the following parameter values: IEC61937 data type=AC-3 (which indicates that the data type corresponding to AC-3 encoding); bit rate=384 (e.g., indicates the bite rate is kilobit per second); dialog normalization average level=−24, bitstream identifier=8, and center mix level=−3, which may be represented as a UEC value of AC-3/384/-24/8/-3). In some examples, a streaming media asset such as a movie or series episode from a specific streaming media source might have a UEC including the following parameter values: IEC61937 data type=AC-3, bit rate=640, dialog normalization average level=−31, bitstream identifier=4, and center mix level: −3, which may be represented as a UEC value of AC-3/640/-31/4/-3. In some examples, the metadata embedder 135 embeds metadata such that more than one source may belong to a given UEC. In some examples, there may be more than one general (e.g., standard cable) cable channel with a UEC of AC-3/384/-24/8/-3 or there may be more than one movie with a UEC of AC-3/640/-31/4/-3.

In some examples, the metadata embedder 135 inserts metadata corresponding to the metering data described above to identify particular events within the media such as, for example, when an advertisement is displayed via product placement, when a dedicated advertisement is displayed, when a particular event occurs within the media (e.g., when a contestant on a television game show answers a question, when a televised movie returns from an advertisement, etc.), etc. Additionally or alternatively, the metadata embedder 135 may embed the metadata into a separate metadata document, such as by encoding the metadata into an M3U8 or other data file that is to be associated with (e.g., included in, appended to, sent prior to, etc.) the media.

The media transmitter 140 of the illustrated example of FIG. 1 is implemented by a logic circuit such as a processor executing instructions, but could additionally or alternatively be implemented by any other circuit, ASIC, DSP, FPGA, and/or other analog and/or digital circuitry. In some examples, some or all of the transcoder 130, the media identifier 125, the metadata embedder 135, and the media transmitter 140 are implemented by the same physical processor.

The media transmitter 140 employs any appropriate technique(s) to select and/or stream the media to a requesting device, such as the media device 150. For example, the media transmitter 140 of the illustrated example selects media that has been identified by the media identifier 125, transcoded by the transcoder 130 and undergone metadata embedding by the metadata embedder 135. The media transmitter 140 then transmits the media to the media device 150 via the network 145 using any protocol such as, for example, IP/QAM, DOCSIS/MoCA, Media Player version 4 (MP4), Adobe Flash (FLV), Moving Picture Experts Group (MPEG) version 2 (MPEG2, MPEG version 4 (MPEG4), etc.

In some examples, the media identifier 125, the transcoder 130, and/or the metadata embedder 130 prepare media for transmission prior to a request from the media device 150. In such examples, the already-prepared media is stored in a data store of the service provider 120 (e.g., such as in a flash memory, magnetic media, optical media, etc.). In such examples, the media transmitter 140 prepares a transport stream to stream or otherwise transmit the already-prepared media to the media device 150 when a request is received from the media device 150. In some examples, the media identifier 125, the transcoder 130, and/or the metadata embedder 130 prepare the media for transmission in response to a request received from the media device 150.

The network 145 of the illustrated example is the Internet. Additionally or alternatively, any other network(s) communicatively linking the service provider 120 and the media device such as, for example, IP/QAM, DOCSIS/MoCA, a private network, a local area network (LAN), a virtual private network (VPN), etc. may be used. The network 145 may comprise any number of public and/or private networks using any type(s) of networking protocol(s).

The media device 150 of the illustrated example of FIG. 1 is a device that is capable of presenting media provided by the media transmitter 140 via the network 145. The media device 150 may be, for example, a television, a set-top-box, such as an IP/QAM hybrid set top box, a DVD player, an Apple TV®, a Roku™ media player, a Boxee™ media player, a Sony PlayStation™, Microsoft® Xbox®, etc. In the illustrated example, the media device 150 outputs media via an example HDMI interface 155 (e.g., an HDMI cable). However, any other number, type(s) and/or format(s) of interface(s) may additionally or alternatively be used. In some examples, multiple HDMI interfaces and/or cables may be used. For example, an audio/video receiver may include multiple HDMI outputs. While a single media device 150 is illustrated, any number and/or type(s) of media devices may be used. In the illustrated example, the media device 150 outputs metadata. In some examples, the metadata is received as part of the media (e.g., embedded in an MPEG2 transport stream). However, in some examples, the metadata is received separately from the media. When the metadata is received separately from the media, the media device 150 multiplexes the metadata into the media (e.g., into the transport stream) prior to sending the media to the display 160. The display 160 of the illustrated example of FIG. 1 is a display device that is capable of displaying media received from the media device 150. In the illustrated example, the display 160 is a television. However, any other number and/or type(s) of display may additionally or alternatively be used such as, for example, a three dimensional television, a high-definition television, a computer monitor, etc.

In the illustrated example, the media monitor 165 intercepts HDMI data transmitted from the media device 150 to the display 160 via the HDMI cable 155. An example implementation of the media monitor 165 is described in further detail in connection with FIG. 2. The example media monitor 165 of FIG. 1 includes an example media interceptor 170. The media interceptor 170 of the illustrated example functions as an HDMI tap that allows the media monitor 165 to intercept the HDMI data. In the illustrated example, the media interceptor 170 implements a first (e.g., pass-through) path such that the HDMI data is passed through the media interceptor 170 to the display 160 as if the media interceptor 170 were not present. However, the media interceptor 170 also implements a second path that also provides the HDMI data (e.g., duplicate HDMI data) to the media monitor 165. In the illustrated example of FIG. 1, the media interceptor 170 is separate from the media monitor 165. In some examples, the media interceptor 170 transmits the HDMI data to the media monitor 165 of FIG. 1 via a wire. However, the media interceptor 170 may transmit the data to the media monitor 165 in any other fashion such as, for example, wirelessly. The example media monitor 165 inspects the HDMI data to identify metadata. The metadata is transmitted from the example media monitor 165 to the central facility 175 for analysis.

In the illustrated example, the media interceptor 170 is separate from the media monitor 165. The media interceptor 170 is located electrically between the media device 150 and the display 160. That is, a cable (e.g., an HDMI cable) which would traditionally extend from the media device 150 to the display 160, is instead routed from the media device 150 to the media interceptor 170. A second cable is then routed from the media interceptor 170 to the display 160. In other words, the media interceptor 170 is to intercept a media stream intermediate a media device and a display. In some examples, the media interceptor 170 may be referred to as being 'in-line' with the electrical connection (e.g., an HDMI cable) between the media device 150 and the display 160. In addition, when the media interceptor 170 is implemented separately from the media monitor 165, the media interceptor 170 splits information transmitted by the media device 150 and sends the information to both the display 160 and the media monitor 165. In the illustrated example, the media interceptor 170 transmits data to the media monitor 165 via an HDMI cable. However, any other type(s) and/or format(s) of data interface may additionally or alternatively be used.

In the illustrated example, the media monitor 165 is implemented separate from the display 160. However, in some examples, the media monitor 165 may be implemented as a part and/or component of the display 160 and/or the media device 150. For example, the display 160 and/or the media device 150 may be sold with the media monitor 165 included and/or as an available attachment. In some examples, the media monitor 165 is located inside a housing of the display. When the media monitor 165 is located inside the housing of the display, the HDMI ports mentioned herein may be replaced with internal data lines (e.g., a bus) to receive and/or intercept HDMI data.

The central facility 175 of the illustrated example is a facility of an audience measurement entity (e.g., the Nielsen Company (US), LLC) and includes an interface to receive reported metering information (e.g., metadata) from the media monitor 165 via the network 145. In the illustrated example, the central facility 175 is provided with software (e.g., a daemon) to extract the metering information and/or metadata from the media monitor 165. For example, the central facility may use any appropriate technique(s) to obtain the metering information and/or metadata such as, for example, an HTTP Secure protocol (HTTPS), a file transfer protocol (FTP), a secure file transfer protocol (SFTP), an HTTP and/or HTTPS GET request, an HTTP and/or HTTPS POST request, etc. In the illustrated example, the central facility 175 stores and analyzes the extracted metering information and/or metadata received from a plurality of different media devices. For example, the central facility 175 may sort and/or group metering information and/or metadata by media source 110 (e.g., by grouping all metering data associated with a particular media source 110). In some examples, the central facility may sort and/or group metering information based on a particular classification of UEC. Any other processing of metering information and/or metadata may additionally or alternatively be performed. In some examples, the central facility 175 adds a timestamp to the metadata upon receipt. Timestamping (e.g., recording a time that an event occurred) enables accurate identification and/or correlation of media that was presented and/or the time that it was presented with the user(s) of the presentation device.

In the illustrated example, the example central facility 175 includes one or more media monitoring applications 180 to process the source classification information and/or information output by the media monitor 165 to perform one or more operations based on that information. For example, the media monitoring application(s) 180 may include a media crediting application to credit media exposure and/or classify a source based on the reference media asset represented by the media identification information output by the media monitor 165. For example, the monitoring applications 180 may utilize the source classification information to consolidate profiles in a database to reduce a burden on a memory. Additionally or alternatively, the media monitoring application(s) 180 may include one or more dynamic advertisement insertion applications to utilize the information output by the media monitor 165 to select companion media, targeted commercials, etc., to provide to the media device 150 for presentation. Additionally or alternatively, the media monitoring application(s) 180 may include one or more secondary media selection insertion applications to utilize the information output by the media monitor 165 to select secondary media to provide to secondary media devices (e.g., such as a smartphone and/or computer associated with one or more of the panelists) for presentation in association with the monitored media being presented by the media device 150.

Figure 2:
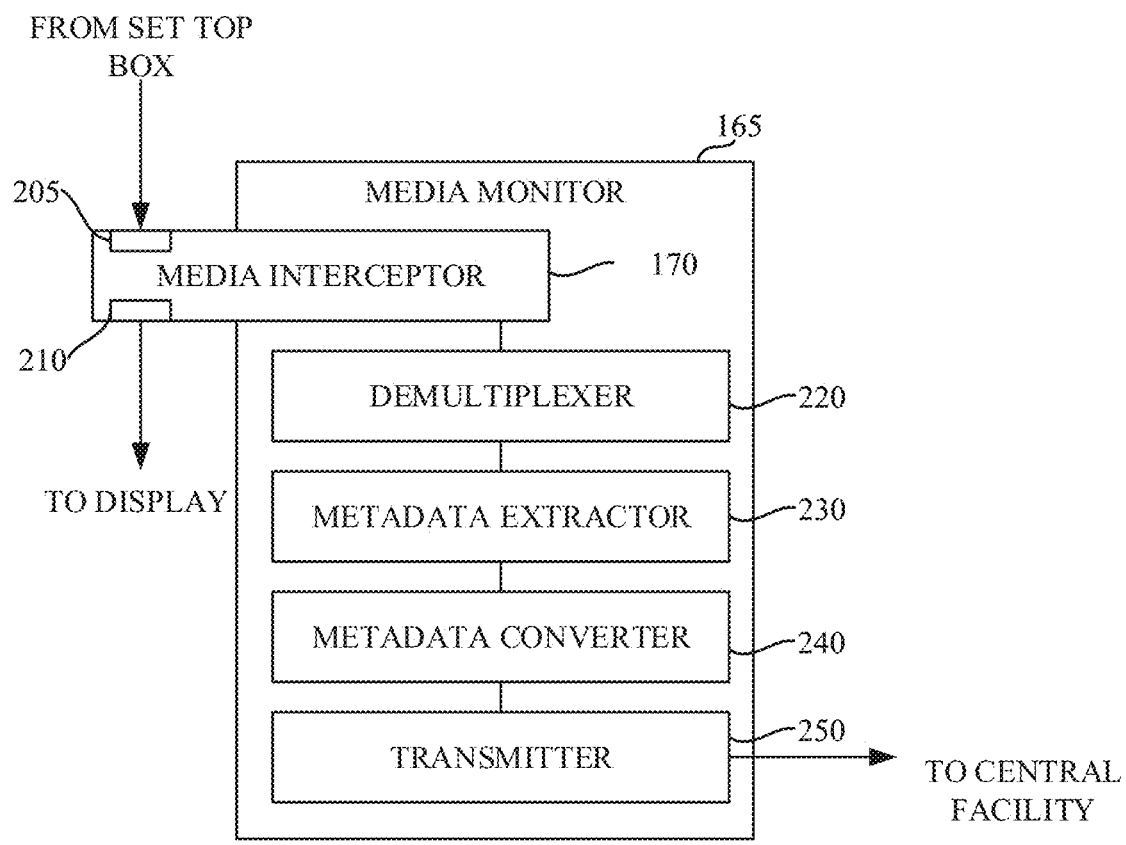
FIG. 2 is a block diagram of an example implementation of the example media monitor of FIG. 1.

FIG. 2 is a block diagram of an example implementation of the media monitor 165 of FIG. 1. The media monitor 165 of the illustrated example of FIG. 2 includes the example media interceptor 170, an example demultiplexer 220, an example metadata extractor 230, an example metadata converter 240, and an example transmitter 250. In the illustrated example of FIG. 2, the media interceptor 170 is represented as being partially inside the media monitor 165 and partially outside the media monitor 165. This internal/external depiction is meant to represent that the media interceptor 170 may be implemented external to the media monitor 165 (as described in FIG. 1), but that the media interceptor 170 may additionally or alternatively be implemented internal to the media monitor 165. In some examples, one or more of the example demultiplexer 220, example metadata extractor 230, and the example metadata converter 240 can be implemented at the central facility 175 instead of the media monitor 165.

The example media interceptor 170 of the illustrated example of FIG. 3 includes one or more HDMI ports. The example media interceptor 170 intercepts media transmitted from the media device 150 to the display 160 via HDMI. In the illustrated example, the media interceptor 170 includes a first example port 205 (e.g., an input port) to receive media transmitted from the media device 150. The example media interceptor 170 includes a second example port 210 (e.g., an output port) to transmit the media received via the first port to the display 160. In the illustrated example of FIG. 2, the media interceptor 170 is depicted as both internal and external to the media monitor 165. As mentioned above, a number of different configurations of the media interceptor 170 may be used. For example, the media interceptor 170 may be external to the media monitor and transmit data to the media monitor 165. That is, the media interceptor 170 may be thought of as an in-line interceptor. In some examples, multiple media interceptors 170 may be used to, for example, monitor multiple media devices. In some other examples, the media interceptor 170 may be implemented as an internal component of the media monitor 165. The media interceptor 170 intercepts HDMI data and forwards the same to the example demultiplexer 220.

The example demultiplexer 220 of the illustrated example of FIG. 2 is implemented by a logic circuit such as a processor executing instructions, but it could additionally or alternatively be implemented by any other logic circuit, an ASIC, DSP, FPGA, and/or other analog and/or digital circuitry. In the illustrated example, the example demultiplexer 220 demultiplexes an MPEG transport stream from the HDMI data. However, the demultiplexer 220 may demultiplex any other format from the HDMI data. Furthermore, the demultiplexer 220 extracts metadata from the transport stream. The metadata is transmitted to the metadata extractor 230.

The metadata extractor 230 of the illustrated example of FIG. 2 is implemented by a logic circuit such as a processor executing instructions, but it could additionally or alternatively be implemented by any other logic circuit, an ASIC, DSP, FPGA, and/or other analog and/or digital circuitry. In some examples, the demultiplexer 220 and the metadata extractor 230 are implemented by the same physical processor. In the illustrated example, the metadata extractor 230 receives metadata from the demultiplexer 220. The metadata extractor 230 parses the metadata to identify UEC(s) contained therein.

In the illustrated example, the metadata extractor 230 identifies the parameters specified in the metadata that match the parameters set by the metadata embedder 135 of the service provider 120. For example, the metadata extractor 230 identifies the parameters specified in the metadata that match the parameters set in an AC-3 encoder in a broadcast studio. In some examples, the metadata extractor 230 identifies the parameters that were set by the metadata embedder 135 when the media was encoded to match the parameters emitted by the media in a home.

In the illustrated example, the metadata extractor 230 extracts the metadata that represent the differentiating values for use in UEC source classification. For example, the metadata extractor 230 extracts parameters from the metadata that are utilized to define different UECs into which sources can be classified, such as IEC61937 data type, bit rate, dialog normalization average level, bitstream identifier, center mix level, etc., as described above. Further, although the preceding parameters are AC-3 parameters in this example, parameters for other types of encoding can be use in other example solutions. Again, while the preceding parameters are AC-3 parameters in this example, the metadata extractor 230 may extract metadata parameters for other types of encoding in other examples.

In some examples, the metadata extractor 230 extracts the metadata from a burst preamble of IEC61937 data type (e.g., an audio stream). In some examples, the IEC61937 data type comprises transport parameters (e.g., a burst preamble) and licensed encoded audio data (e.g., an encoded preamble). In some examples, the licensed encoded audio data requires further processing and/or additional processing equipment to analyze. In contrast, the transport parameters do not require any additional processing and/or processing equipment. As such, the metadata extractor 230 extracting the metadata from the transport parameters of the IEC61937 data type improves the operation of a computing system because it eliminates further processing and does not require any additional processing equipment.

In the illustrated example, the metadata extractor 230 extracts metadata to classify the source (e.g., a media source, a service provider, etc.) based on the UEC. For example, a general cable channel might have a UEC including the following parameter values: IEC61937 data type=AC-3; bit rate=384; dialog normalization average level=-24, bitstream identifier=8, and center mix level=-3, which corresponds to a UEC value of AC-3/384/-24/8/-3. In some examples, a streaming media asset such as a movie or series episode from a specific streaming media source might have a UEC including the following parameter values: IEC61937 data type=AC-3, bit rate=640, dialog normalization average level=-31, bitstream identifier=4, and center mix level: -3, which corresponds to a UEC value of AC-3/640/-31/4/-3. In some examples, more than one source may belong to a given UEC. In some examples, there may be more than one general cable channel with a UEC value of AC-3/384/-24/ 8/-3 or there may be more than one movie with a UEC value of AC-3/640/-31/4/-3.

In the illustrated example, UECs defined provide commercially valuable differentiators for identifying different media sources. For example, UECs can be defined for which no general cable channels share UECs with any streaming media assets. In such examples, it is possible to discriminate between streaming sources and general cable channels by UEC alone to determine source classifications. As such, the metadata extractor 230 extracts parameters from metadata to classify a source based on UECs. In the illustrated example, the metadata extractor 230 extracts the parameters from the metadata and generates a table containing the parameters. For example, the metadata extractor 230 may extract the metadata and generate a mapping of encoding parameters to UEC classes. The metadata extractor 230 may store and maintain the mapping in one or more data structures, such as table data structure corresponding to Table 300 illustrated in FIG. 3. In the illustrated example of FIG. 3, the Table 300 includes the parameters of the HDMI audio encoding metadata used to define the UECs include: EN: IEC61937 Data Type (audio encoding data type), EN: Audio Bit Rate (audio encoding bit rate), EN: dialnorm (dialogue level), Dolby BSID (bit stream identifier), Dolby CMixLev (center mix level), Dolby LFEon (low frequency energy on), acmod/ AMODE (audio compression mode). However, any other type of audio metadata may be used to define the UECs.

In the illustrated example Table 300, column 302 lists the different UECs capable of being defined based on the values of the different parameters listed in columns 5-11, which the metadata extractor 230 obtained from the HDMI audio encoding metadata that was embedded by the metadata embedder 135 of the service provider 120. The metadata extractor 230 of the illustrated example determines a disambiguation confidence for the UEC(s). As used herein, disambiguation confidence refers to the ability of defined UEC(s) to uniquely identify a corresponding media source. In some examples, the metadata extractor 230 determines a disambiguation confidence based on determining a number of values in a first UEC (e.g., a UEC that was extracted from metadata) that match a number of values and/or parameters in a defined UEC. As such, if the metadata extractor 230 determines that all the parameters in a first UEC (e.g., a query UEC) match all the parameters from a UEC of a known media source, then the metadata extractor 230 determines the disambiguation confidence to be 100%. Likewise, the metadata extractor 230 would reduce the disambiguation confidence based on the number of parameters in the query UEC that are different than the parameters in a UEC with a known media source. For example, column 304 of Table 300 represents the disambiguation confidence (i.e., the ability) of the defined UECs to uniquely identify the corresponding media source listed in column 306 of Table 300. In the illustrated example, a disambiguation confidence of 100% indicates that the corresponding UEC can uniquely identify the corresponding media source, whereas a disambiguation confidence of 50% means that the corresponding UEC can narrow the source identification to one of 2 possible sources, whereas a disambiguation confidence of 33% means that the corresponding UEC can narrow the source identification to one of 3 possible sources.

In the illustrated example of FIG. 2, the metadata extractor 230 calculates a disambiguation confidence which indicates the likelihood of the UEC(s) corresponding to a particular source. For example, the metadata extractor 230 may classify a UEC consisting of: IEC61937 data type=AC-3; bit rate=384; dialog normalization average level=−24, bitstream identifier=8, and center mix level=−3 (abbreviated AC-3/384/-24/8/-3) as corresponding to a particular service provider. As such, when the metadata extractor 230 extracts metadata and identifies media as having a UEC consisting of: IEC61937 data type=AC-3; bit rate=384; dialog normalization average level=−24, bitstream identifier=8, and center mix level=−3 (abbreviated AC-3/384/-24/8/-3), the metadata extractor 230 of the illustrated example determines that the metadata (e.g., the media corresponding to the metadata) has a disambiguation confidence of 100% and corresponds to the particular service provider associated with that UEC (e.g., a source from column 308 in Table 300 of FIG. 3). The metadata extractor 230 of the illustrated example populates the UEC mapping data structure (e.g., such as a table corresponding to Table 300) with a disambiguation confidence for each source and forwards the populated table to the metadata converter 240.

The example metadata converter 240 of FIG. 2 is implemented by a logic circuit such as a processor executing instructions, but it could additionally or alternatively be implemented by any other logic circuit, an ASIC, DSP, FPGA, and/or other analog and/or digital circuitry. In some examples, some or all of the demultiplexer 220, the metadata extractor 230, and the metadata converter 240 are implemented by the same physical processor. In the illustrated example, the metadata converter 240 converts the information and/or metadata extracted by the metadata extractor 230 into a converted metadata format for transmission to the central facility 175. For example, the metadata converter 240 may encrypt, decrypt, compress, modify, etc., the information, metadata and/or portions of the metadata to, for example, reduce the amount of data to be transmitted to the central facility 175. In the illustrated example, the metadata converter 240 adds a timestamp to the information and/or metadata prior to converting the metadata. Timestamping (e.g., recording a time that an event occurred) enables accurate identification and/or correlation of media that was presented with the user(s) of the presentation device present at the corresponding time(s).

The transmitter 250 of the illustrated example of FIG. 3 is implemented by a logic circuit such as a processor executing instructions, but it could additionally or alternatively be implemented by any other logic circuit, an ASIC, DSP, FPGA, and/or other analog and/or digital circuitry. In some examples, some or all of the demultiplexer 220, the metadata extractor 230, the metadata converter 240, and the transmitter 250 are implemented by the same physical processor. In the illustrated example, the transmitter 250 transmits the converted information and/or metadata to the central facility 175 via, for example, the Internet. While the converted information and/or metadata is transmitted in substantially real-time in the illustrated example, in some examples, the converted information and/or metadata is stored, cached, and/or buffered before being transmitted to the central facility 175. Additionally or alternatively, the transmitter 250 may transmit an identifier of the media monitor 165 and/or the media device 150 to enable the central facility 175 to correlate the metadata with a panelist, a group of panelists, demographic(s), etc. In some examples, a separate people meter is used to identify persons in the local audience of the monitored device. In the illustrated example, the central facility 175 is associated with an audience measurement company and is not involved with the delivery of media to the media device. In some examples, the central facility 175 applies a timestamp upon receipt of the converted information and/or metadata.

While an example manner of implementing the media monitor 165 of FIG. 1 is illustrated in FIG. 2, one or more of the elements, processes and/or devices illustrated in FIG. 2 may be combined, divided, re-arranged, omitted, eliminated and/or implemented in any other way. Further, the example media interceptor 170, the example demultiplexer 220, the example metadata extractor 230, the example metadata converter 240, the example transmitter 250, and/or, more generally, the example media monitor 165 of FIG. 2 may be implemented by hardware, software, firmware and/or any combination of hardware, software and/or firmware. Thus, for example, any of the example media interceptor 170, the example demultiplexer 220, the example metadata extractor 230, the example metadata converter 240, the example transmitter 250, and/or, more generally, the example media monitor 165 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example media interceptor 170, the example demultiplexer 220, the example metadata extractor 230, the example metadata converter 240, the example transmitter 250, and/or, more generally, the example media monitor 165 is/are hereby expressly defined to include a non-transitory computer readable storage device or storage disk such as a memory, a digital versatile disk (DVD), a compact disk (CD), a Blu-ray disk, etc. including the software and/or firmware. Further still, the example media monitor 165 of FIG. 1 may include one or more elements, processes and/or devices in addition to, or instead of, those illustrated in FIG. 2, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 4:
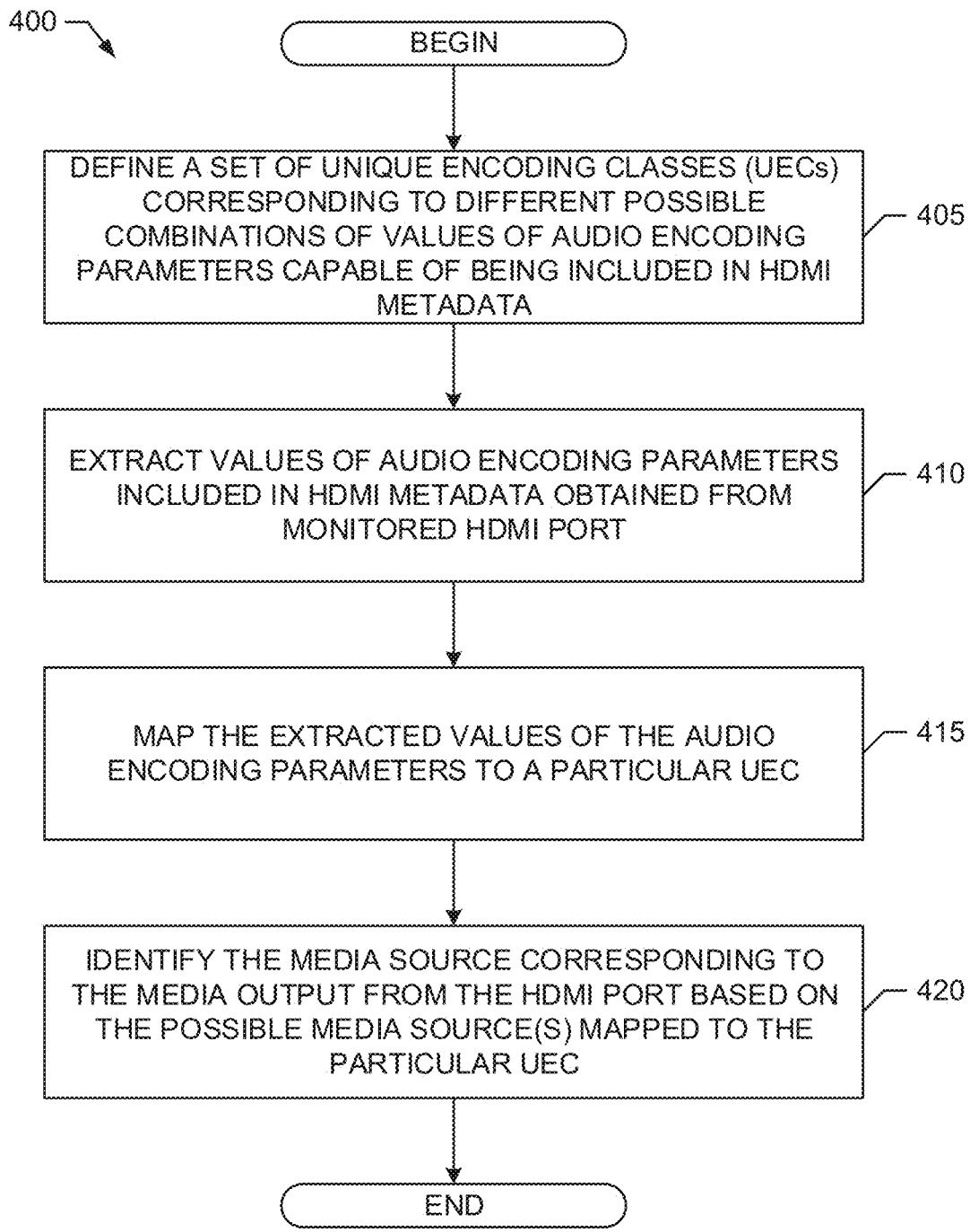
FIG. 4 is a flowchart representative of machine readable instructions which may be executed to implement the media monitor of FIGS. 1 and/or 2 to perform source classification using HDMI audio metadata in accordance with teachings of this disclosure.

A flowchart representative of example hardware logic, machine readable instructions, hardware implemented state machines, and/or any combination thereof for implementing the media monitor 165 of FIG. 2 is shown in FIG. 4. The machine readable instructions may be one or more executable programs or portion(s) of an executable program for execution by a computer processor such as the processor 512 shown in the example processor platform 500 discussed below in connection with FIG. 5. The program may be embodied in software stored on a non-transitory computer readable storage medium such as a CD-ROM, a floppy disk, a hard drive, a DVD, a Blu-ray disk, or a memory associated with the processor 512, but the entire program and/or parts thereof could alternatively be executed by a device other than the processor 512 and/or embodied in firmware or dedicated hardware. Further, although the example program is described with reference to the flowchart illustrated in FIG. 4, many other methods of implementing the example media monitor 165 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIG. 3 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 4 is a flowchart representative of example machine-readable instructions 400 which may be executed to implement the example media monitor 165 of FIGS. 1 and/or 2. In the illustrated example of FIG. 4, execution of the example machine-readable instructions 400 begins when the metadata extractor 230 defines a set of unique encoding classes (UECs) corresponding to different possible combinations of values of audio encoding parameters capable of being included in HDMI metadata (block 405). As described above, the UECs can be mapped to different possible media sources providing the media associated with the audio encoding parameters. For example, the metadata extractor 230 may classify a UEC consisting of: IEC61937 data type: =AC-3; bit rate=384; dialog normalization average level=−24, bitstream identifier=8, and center mix level=−3 (abbreviated AC-3/384/−24/8/−3) as corresponding to a particular media source.

The metadata extractor 230 extracts values of audio encoding parameters included in HDMI metadata obtained from a monitored HDMI port (block 410). For example, the metadata extractor 230 extracts values of audio encoding parameters included in HDMI metadata that was obtained from the media interceptor 170.

The metadata extractor 230 maps the extracted values of the audio encoding parameters to a particular UEC (block 415). For example, the metadata extractor 230 may map the extracted values of the audio encoding parameters to a UEC consisting of: IEC61937 data type: =AC-3; bit rate=384; dialog normalization average level=−24, bitstream identifier=8, and center mix level=−3 (abbreviated AC-3/384/−24/8/−3) as corresponding to a particular media source. As such, when the metadata extractor 230 extracts metadata and identifies the extracted values as having a UEC consisting of: IEC61937 data type: =AC-3; bit rate=384; dialog normalization average level=−24, bitstream identifier=8, and center mix level=−3 (abbreviated AC-3/384/−24/8/−3), the metadata extractor 230 of the illustrated example determines that the metadata (e.g., the media corresponding to the metadata) has a disambiguation confidence of 100% and corresponds to the particular media source.

The metadata extractor 230 identifies the media source corresponding to the media output from the HDMI port based on the possible media source(s) mapped to the particular UEC (block 420). For example, the metadata extractor 230 may classify a UEC consisting of: IEC61937 data type=AC-3 as corresponding to Media Source XYZ. As such, when the metadata extractor 230 extracts metadata and identifies the extracted values as having a UEC consisting of: IEC61937 data type: =AC-3, the metadata extractor 230 of the illustrated example determines that the metadata corresponds to Media Source XYZ. Once all the metadata has been classified, the process 400 ends.

Figure 5:
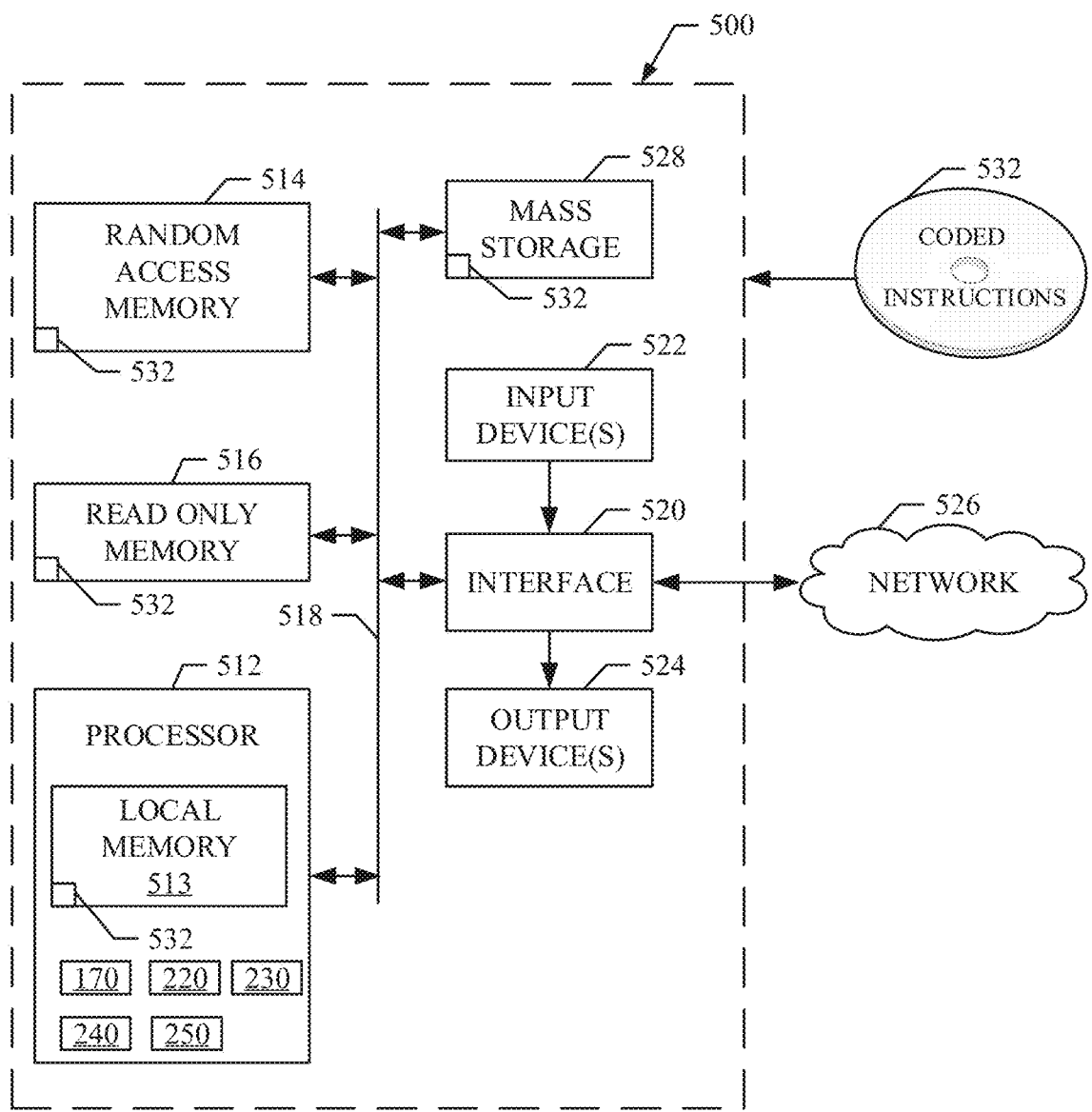
FIG. 5 is a block diagram of an example processor platform structured to execute the instructions of FIG. 4 to implement the media monitor to perform source classification using HDMI audio metadata in accordance with teachings of this disclosure.

FIG. 5 is a block diagram of an example processor platform 500 structured to execute the instructions of FIG. 4 to implement the media monitor 165 of FIGS. 1 and/or 2. The processor platform 500 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset or other wearable device, or any other type of computing device.

The processor platform 500 of the illustrated example includes a processor 512. The processor 512 of the illustrated example is hardware. For example, the processor 512 can be implemented by one or more integrated circuits, logic circuits, microprocessors, GPUs, DSPs, or controllers from any desired family or manufacturer. The hardware processor may be a semiconductor based (e.g., silicon based) device. In this example, the processor 512 implements the example media interceptor 170, the example demultiplexer 220, the example metadata extractor 230, the example metadata converter 240, the example transmitter 250, and/or, more generally, the example media monitor 165.

The processor 512 of the illustrated example includes a local memory 513 (e.g., a cache). The processor 512 of the illustrated example is in communication with a main memory including a volatile memory 514 and a non-volatile memory 516 via a bus 518. The volatile memory 514 may be implemented by Synchronous Dynamic Random Access Memory (SDRAM), Dynamic Random Access Memory (DRAM), RAMBUS® Dynamic Random Access Memory (RDRAM®) and/or any other type of random access memory device. The non-volatile memory 516 may be implemented by flash memory and/or any other desired type of memory device. Access to the main memory 514, 516 is controlled by a memory controller.

The processor platform 500 of the illustrated example also includes an interface circuit 520. The interface circuit 520 may be implemented by any type of interface standard, such as an Ethernet interface, a universal serial bus (USB), a Bluetooth® interface, a near field communication (NFC) interface, and/or a PCI express interface.

In the illustrated example, one or more input devices 522 are connected to the interface circuit 520. The input device(s) 522 permit(s) a user to enter data and/or commands into the processor 412. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 524 are also connected to the interface circuit 520 of the illustrated example. The output devices 524 can be implemented, for example, by display devices (e.g., a light emitting diode (LED), an organic light emitting diode (OLED), a liquid crystal display (LCD), a cathode ray tube display (CRT), an in-place switching (IPS) display, a touchscreen, etc.), a tactile output device, a printer and/or speaker. The interface circuit 520 of the illustrated example, thus, typically includes a graphics driver card, a graphics driver chip and/or a graphics driver processor.

The interface circuit 520 of the illustrated example also includes a communication device such as a transmitter, a receiver, a transceiver, a modem, a residential gateway, a wireless access point, and/or a network interface to facilitate exchange of data with external machines (e.g., computing devices of any kind) via a network 526. The communication can be via, for example, an Ethernet connection, a digital subscriber line (DSL) connection, a telephone line connection, a coaxial cable system, a satellite system, a line-of-site wireless system, a cellular telephone system, etc.

The processor platform 500 of the illustrated example also includes one or more mass storage devices 528 for storing software and/or data. Examples of such mass storage devices 528 include floppy disk drives, hard drive disks, compact disk drives, Blu-ray disk drives, redundant array of independent disks (RAID) systems, and digital versatile disk (DVD) drives.

The machine executable instructions 532 of FIG. 4 may be stored in the mass storage device 528, in the volatile memory 514, in the non-volatile memory 516, and/or on a removable non-transitory computer readable storage medium such as a CD or DVD.

From the foregoing, it will be appreciated that example methods, apparatus and articles of manufacture have been disclosed that use HDMI audio metadata to classify sources of media. The disclosed methods, apparatus and articles of manufacture improve the efficiency of using a computing device by extracting HDMI audio metadata without requiring encoding/decoding the audio metadata. Further, examples disclosed herein extract the HDMI audio metadata from particular parameters (e.g., IEC61937 burst preamble), thereby eliminating the need for subsequent processing of the HDMI audio metadata. The disclosed methods, apparatus and articles of manufacture are accordingly directed to one or more improvement(s) in the functioning of a computer.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An apparatus to perform source classification, the apparatus comprising:
at least one memory;
instructions; and
processor circuitry to execute the instructions to:
extract values of audio encoding parameters from high definition multimedia interface (HDMI) metadata obtained from a monitored HDMI port of a media device, the HDMI metadata corresponding to media being output from the monitored HDMI port;
map the extracted values of the audio encoding parameters to a first unique encoding class (UEC) in a set of defined UECs, different ones of the set of defined UECs corresponding to different combinations of possible values of the audio encoding parameters capable of being included in the HDMI metadata; and
identify a media source corresponding to the media that is output from the monitored HDMI port based on one or more possible media sources mapped to the first UEC.

2. The apparatus of claim 1, wherein the HDMI metadata is extracted prior to being decoded.

3. The apparatus of claim 1, wherein the HDMI metadata is included in an audio stream output from the monitored HDMI port of the media device.

4. The apparatus of claim 3, wherein the audio stream includes transport parameters and licensed encoded audio data.

5. The apparatus of claim 4, wherein the extracted values correspond to the transport parameters.

6. The apparatus of claim 1, wherein the processor circuitry is to determine a disambiguation confidence associated with the map of the extracted values of the audio encoding parameters to the first UEC.

7. The apparatus of claim 6, wherein the processor circuitry is to determine the disambiguation confidence based on a number of values in the first UEC that match a number of values in a defined UEC.

8. The apparatus of claim 7, wherein the processor circuitry is to identify the media source is mapped to the first UEC.

9. An apparatus to perform source classification, the apparatus comprising:
a media interceptor to intercept high definition multimedia interface (HDMI) data from a media stream output from a monitored HDMI port of a media device; and
a metadata extractor to:
parse the HDMI data to determine that first media encoding parameters contained in the HDMI data correspond to a first unique encoding class (UEC) of a set of defined UECs, different ones of the set of defined UECs corresponding to different possible combinations of media encoding parameters capable of being included in the HDMI data; and
identify a media source corresponding to the media stream output based on one or more possible media sources corresponding to the first UEC.

10. The apparatus of claim 9, further including a metadata converter to convert the HDMI data into a converted metadata format for transmission to a central facility.

11. The apparatus of claim 9, further including a demultiplexer to demultiplex and provide the HDMI data to the metadata extractor.

12. The apparatus of claim 9, wherein the metadata extractor is to determine a disambiguation confidence based on values of the first media encoding parameters associated with the first UEC.

13. The apparatus of claim 12, wherein the metadata extractor is to determine the disambiguation confidence based on a number of values in the first UEC that match a number of values in a defined UEC.

14. The apparatus of claim 9, wherein the media stream is an audio stream, the media stream includes transport parameters and licensed encoded audio data, and the values of the first media encoding parameters correspond to the transport parameters.

15. An apparatus to perform source classification, the apparatus comprising:
at least one memory;
instructions in the apparatus; and
processor circuitry to execute the instructions to:
intercept high definition multimedia interface (HDMI) data of a media stream output from a monitored HDMI port of a media device;
identify HDMI metadata;
parse the HDMI metadata;
determine that first media encoding parameters contained in the HDMI metadata correspond to a first unique encoding class (UEC) of a set of defined UECs, different ones of the set of defined UECs corresponding to different possible combinations of media encoding parameters capable of being included in the HDMI metadata; and
identify a media source corresponding to media that is output based on one or more possible media sources corresponding to the first UEC.

16. The apparatus of claim 15, wherein the processor circuitry is to convert the HDMI metadata into a converted metadata format for transmission to a central facility.

17. The apparatus of claim 15, wherein the processor circuitry is to demultiplex the HDMI metadata.

18. The apparatus of claim 15, wherein the processor circuitry is to determine a disambiguation confidence based on values of the first media encoding parameters associated with the first UEC.

19. The apparatus of claim 18, wherein the processor circuitry is to determine the disambiguation confidence based on a number of values in the first UEC that match a number of values in a defined UEC.

20. The apparatus of claim 18, wherein the media stream is an audio stream, the audio stream includes transport parameters and licensed encoded audio data, and the values of the first media encoding parameters correspond to the transport parameters.

* * * * *